United States Patent [19]
Hannigan et al.

[11] Patent Number: 5,832,073
[45] Date of Patent: *Nov. 3, 1998

[54] CONFIGURABLE I/O PANEL OR TELEPHONY SYSTEMS

[75] Inventors: Matthew T. Hannigan; Paul Bonomo; Ronald R. Carleton, all of San Jose, Calif.

[73] Assignee: Siemens Business Communication Systems, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 624,901

[22] Filed: Mar. 27, 1996

[51] Int. Cl.[6] .............................. H04M 3/00; H04M 1/00; H02B 1/20; H05K 9/00

[52] U.S. Cl. ........................ 379/325; 379/325; 379/326; 379/327; 379/328; 379/329; 379/330; 379/399; 361/826; 361/827; 361/828; 361/829; 174/35 C; 174/35 R; 174/35 GC

[58] Field of Search ..................................... 379/325, 326, 379/327, 328, 329, 330, 399; 361/826, 827, 828, 829; 174/35 C, 35 R, 35 GC

[56] References Cited

U.S. PATENT DOCUMENTS

| | | | |
|---|---|---|---|
| 5,006,959 | 4/1991 | Freige et al. | 361/384 |
| 5,175,670 | 12/1992 | Wang | 361/390 |
| 5,305,187 | 4/1994 | Umezu et al. | 361/784 |
| 5,406,026 | 4/1995 | Yamaguchi et al. | 174/35 R |
| 5,509,066 | 4/1996 | Saligny | 379/327 |

OTHER PUBLICATIONS

*IBM 9751 LBX System Service Manual,* IBM Rolm Systems, Mar. 1989 (Rev.2), pp. 8–21–8–24.

*Primary Examiner*—Fan S. Tsang
*Assistant Examiner*—Allan Hoosain

[57] ABSTRACT

A configurable I/O panel assembly includes an upper and a lower I/O panel (connector plate), and a cover plate. A plurality of upper I/O panels is provided, from which the upper I/O panel is selected. Similarly, a plurality of lower I/O panels is provided, from which the lower I/O panel is selected. The cover plate is selected from a plurality of cover plates. Openings are formed in the upper and lower I/O panels for receiving cable connectors. Typical connectors include, but are not limited to, 50-pin connectors, RS-232 connectors, 9-pin D-sub connectors, RJ-45 jacks and BNC connectors. Grounding and other signal conditioning circuitry for the connectors are provided to protect against EMI radiation.

20 Claims, 6 Drawing Sheets

CONFIGURABLE I/O PANEL OR TELEPHONY SYSTEMS

TECHNICAL FIELD

The present invention generally relates to cover panels of a cabinet for housing electronic components, and more specifically to input/output (I/O) panels for cabinets used in telephony systems.

BACKGROUND ART

In a typical installation of a telephony system, such as a private branch exchange (PBX) switch, there are large amounts of cabling exiting the cabinet which houses the switching electronics and other related components. The nature of telephony systems necessitates the use of large numbers of cables, namely that a telephony system serves to provide communication lines to end users within a particular installation. Since typical installations require anywhere from tens to hundreds of communication lines, a correspondingly high number of cables is needed to provide these lines.

A "system" generally includes a cabinet which houses a host of switching electronics, power supplies and other computing components. Typically, the switching electronics are organized within the cabinet into a number of shelves, occupying the top portion of the cabinet. Next, are the power supply components followed by computing components which provide the switching functions and system administration management. The various boards which make up the system fit into the shelves and plug into a backplane located at the rear of the cabinet.

The backplane interconnects the various parts of the system, providing power to the various components and providing data and control access between the switching electronics and the computer. In addition, the backplane provides access to the I/O ports of the switching electronics. This usually takes the form of pins to which the external cables make electrical connection. Other systems may employ the use of punch-down blocks for making the same connections.

Early systems employed a cabling scheme whereby the cables were brought out of the telephony system and directly wire wrapped to the backplane. Modern systems typically employ cables which have connectors that plug into the pins of the backplane. The cables are arranged in bundles, plugged into the backplane within the cabinet and routed out of the cabinet to a backboard, which serves as the interface between the telephony system and the facility being serviced by the system. Telephone lines from various terminating equipment devices, such as telephones, fax machines, etc., are routed to the backplane where connections to the telephony system are made.

In order to ensure adequate protection against electromagnetic interference (EMI), this scheme of directly wiring the cables to the backplane and dropping them out of the cabinet requires individual shielding of the cables and grounding of each of the shielded cables. This is a labor intensive activity, as the outer jacket of the end of the cable which is wired to the backplane must be stripped off and shielded with a ferrule. The cable must then be grounded to the cabinet at the point where the cable exits the cabinet. Field installation using this method tends to be labor intensive.

Other systems employ a single preconfigured panel attached to a sidewall at the rear of the cabinet. The panel contains a set of connectors, one side of which faces the exterior of the cabinet and the other side of which face the interior region of the cabinet. Within the interior of the cabinet, connections are made between the backplane and the interior facing part of the connectors. In this way, the external cables need not be brought into to the cabinet. Rather, the cables need only be connected to the appropriate connectors in order to access the system. This approach, however, lacks flexibility, resulting in increased installation costs and adding complexity to upgrading procedures and maintenance efforts.

Moreover, for a given installation, the system requirements generally will be quite different from those of another installation. The number of communication lines, the desired features of the system and the administrative and maintenance requirements will vary from one installation to the next. These variations impose varying cabling requirements among different installations, which in turn require differently configured panels for cable access to the system backplane. This may require that panels be custom designed for a given installation. In such circumstances, the manufacturing costs are increased, since new panels must be designed, fabricated and the resulting additional inventory tracked.

These fixed configuration panels also add to the complexity of upgrading an existing system. Consider, for example, the addition of a switch in an existing installation. Typically, the new switch must be interconnected with the existing switch or switches in order for the entire system to be properly coordinated. Using a fixed configuration panel requires new panels to be designed to allow for the additional cabling requirements of adding another switch. This unnecessarily adds cost to the upgrade. Similar costs are incurred if, within an existing cabinet, the electronics are upgraded. Any changes in the cabling requirements will necessitate the manufacture of a new panel. For example, the installation of additional communication lines within a cabinet would call for a change in the connector panel to accommodate the additional lines.

What is needed is a flexible cabling system that provides adequate EMI shielding and grounding in a simple and cost-effective manner. In addition, the cabling system should be adaptable to accommodate any system requirements and to the changing system requirements in an existing installation. What is also needed is a simple and inexpensive means for providing inter-cabinet cabling.

SUMMARY OF THE INVENTION

An I/O panel assembly is disclosed for use in a cabinet which houses the electronics of a telephony system. The assembly is composed of at least a first connector panel and a second connector panel. A cover plate is coupled to and vertically aligned with the first connector panel, and is further coupled to and vertically aligned with the second connector panel. A plurality of connector panels is provided from which the first and second connector panels are selected for a given installation. Likewise, a plurality of cover plates is provided from which the desired cover plate is selected for a particular application.

Each of the first and second connector panels (also referred to as upper and lower connector trays) is electrically conductive and includes a front plate member and a mounting member which laterally extends from a side of the front plate member in a direction perpendicular to the face of the front plate. Formed through each front plate is a series of openings into which connectors are fixedly attached. Thus, a variety of combinations of connector types and configurations is provided by the plurality of connector panels. The mounting members serve to couple the connector panels to the sidewalls of the cabinet. When attached to the sidewalls, the surfaces of the mounting members contact the sidewall, thus ensuring electromagnetic compatibility (EMC) between the interior of the cabinet and the connector panels.

In addition, the side of each connector panel opposite the side from which the mounting plate extends includes a gasket interface. In like manner, the side of each cover plate opposite the gasketed side includes a similar gasket interface. In this way, a gasketed cabinet door that is installed between the two I/O panel assemblies will come into contact with the gasket interfaces, thus providing EMC containment within the cabinet.

The middle cover plate is removably attached to each of the first and second connector panels at opposite ends of the cover plate. The cover plate includes a plate member having a metal gasket formed on a side of the plate member. The gasketed side of the cover plate is aligned with the mounting member of each of the upper and lower connector panels. Thus, when the I/O assembly is installed, the gasketed side abuts the sidewall of the cabinet. This provides EMC containment in a manner similar to that provided by the mounting members of the connector panels. However, since the cover plate is attached to the connector panels, rather than to the sidewall of the cabinet as the connector panels are, its removal and replacement is easily accomplished.

In a preferred embodiment of the present invention, an I/O panel assembly is installed along each of the opposed sidewalls of the cabinet. In addition, the connector panels are aligned with the various components contained in the cabinet to facilitate wiring of the cable connectors to the system components. Thus, a connector panel containing connectors intended for the terminal equipment devices will be vertically positioned near to the communications circuitry. Likewise, a connector panel which provides cable access for system administration and Maintenance will be positioned near to the computing subsystem. Typical cable connectors include standard 50-pin connectors, RS-232 connectors, 9-pin D-sub connectors, RJ-45 jacks and BNC connectors.

In another embodiment of the invention, signal conditioning circuitry is provided on the connector panels for each of the openings formed therein. The circuitry is connected to the pins of the connectors which are received in the openings to provide filtering and conditioning of the signals carried by the pins. This scheme simplifies the shielding and grounding requirements of the cabling.

Standard sizes of the connector panels and the cover plate can be designed in one design cycle and manufactured as the need arises. By mixing and matching the components of the I/O panel assembly, all current and future system cabling requirements can be met. In addition, as the requirements of an existing system change the I/O panel assembly can be easily reconfigured and the old components can be reused in other installations. By comparison, a fixed configuration panel may not be reusable if it was a custom designed panel for a particular installation.

Inter-cabinet cabling between two or more cabinets placed side-by-side is made possible by selecting appropriately dimensioned connector panels and cover plates. The cover plates can be positioned so that they are aligned with the power components of the switch. Thus, when it comes time to install an additional switch, inter-cabling between the switches can be easily accomplished simply by removing the cover plates and installing the necessary cabling. There is no need to redesign and replace the entire connector panel.

BEST MODE FOR CARRYING OUT THE INVENTION

Figure 1:
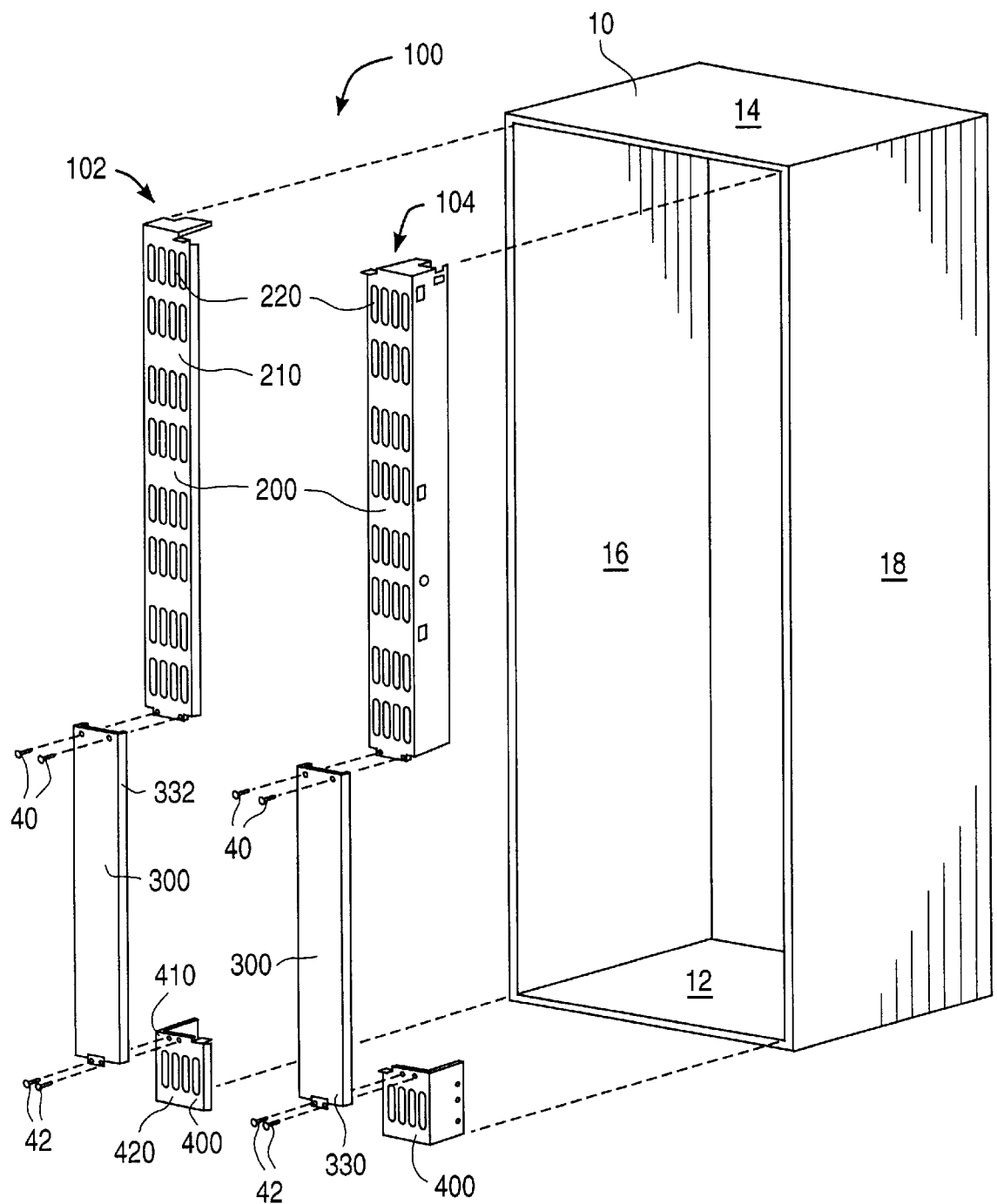
FIG. 1 is an exploded view of a cabinet containing the I/O panels of the present invention.

FIG. 1 shows an exploded rear view of a cabinet 10 which typically is used to house the electronic components of a telephony system, such as a PBX switch. The cabinet is of standard construction, having a bottom base plate 12 and a top member 14. Viewing the cabinet 10 from the rear, opposed left and right sidewalls 16, 18 are vertically disposed between the base plate 12 and the top member 14 of the cabinet, leaving an opening in the front and rear of the cabinet 10 for access to the interior of the cabinet.

Figure 3:
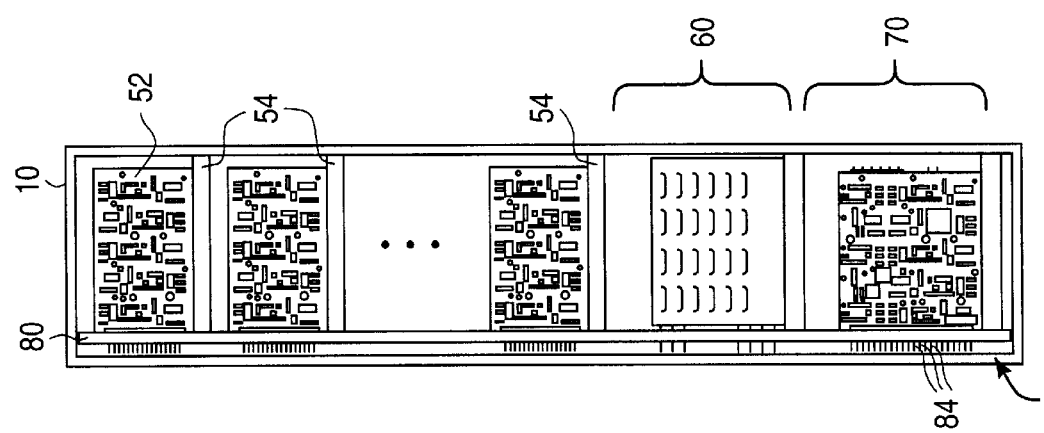
FIG. 3 is a side view of the cabinet shown in FIG. 2.
Figure 2:
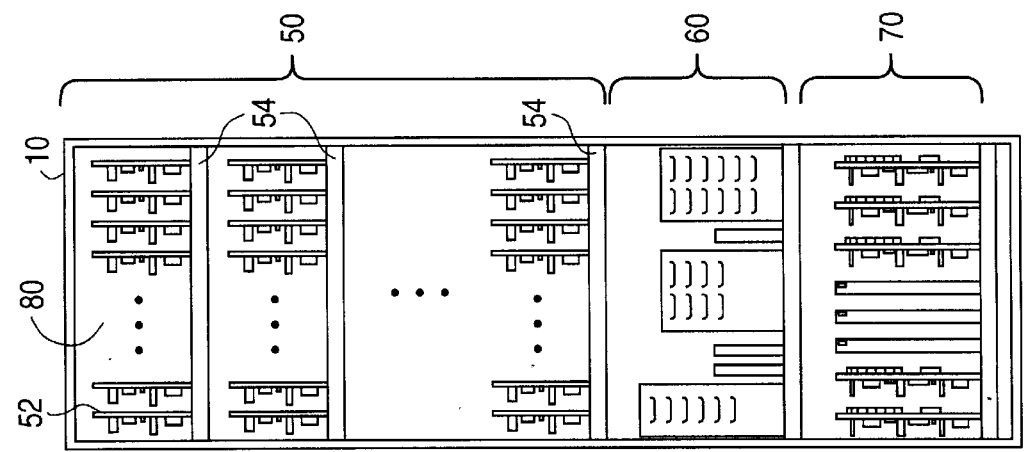
FIG. 2 is a front view of a cabinet containing the components of a telephony system.

Referring to FIGS. 2 and 3, front and side views of the cabinet 10 are illustrated, showing a typical arrangement of components ordinarily found in a telephony system. The top portion of the cabinet 10 houses the communication circuitry 50 which provides the switching electronics of the system. As can be seen in FIG. 2, the communication circuitry 50 is organized into a plurality of line circuit cards 52, which in turn is arranged in a series of shelves 54. The line cards 52 plug into a backplane 80 located at the rear of the cabinet. In FIG. 3, the rear 82 of the backplane shows a set of pins 84 typically used in such applications. The backplane 80 incorporates appropriately formed traces (not shown) whereby the I/O ports of the line cards 52 plugged into the backplane can be accessed by the pins 84 projecting from the rear 82 of the backplane. In this way, the I/O ports of the communication circuitry 50 become available simply by accessing the rear side 82 of the backplane.

Continuing with the internal components of the cabinet 10, the middle portion of the cabinet includes the power subsystem 60. The power subsystem 60 usually includes a regulated power supply, and in some installations may include an uninterruptable power supply. The lower portion of the cabinet houses the computer subsystem 70, which generally includes components such as a computer board, I/O boards and I/O devices such as disk drives and tape drives. The components of the power subsystem 60 and of the computer subsystem 70 are also plugged into the backplane 80 or otherwise connected to the backplane. Access to these components is made from the rear 82 of the backplane via the pins 84 in a manner similar to the I/O ports of the communication circuitry 50, as discussed above.

Returning to FIG. 1, the discussion continues with a description of a preferred embodiment of the I/O panel assembly of the present invention. The I/O panel assembly 100 is composed of two panel subassemblies, a left panel subassembly 102 and a right panel subassembly 104. Each panel subassembly is further composed of an upper connector tray member 200, a cover plate 300 and a lower connector tray member 400. The left and right panel subassemblies 102, 104 are attached respectively to the left and right sidewalls 16, 18 of the cabinet 10, near the rearward edges of the sidewalls.

The upper connector trays 200 are used for access to the I/O ports of the communication circuitry 50, and so are vertically positioned near to the circuitry. Similarly, the lower connector trays 400 are used to access the I/O ports of the computer subsystem 70, and so are positioned near the computer. The cover plates 300 are vertically positioned to provide access to the power subsystem 60. Although there typically are no associated I/O ports, the power subsystem nevertheless needs to be accessed in multi-cabinet installations involving two or more adjacently placed cabinets 10 for side-to-side cabling among the power subsystems. The presence of the removable cover plates 300 facilitates the cabling in such installations.

Figure 4:
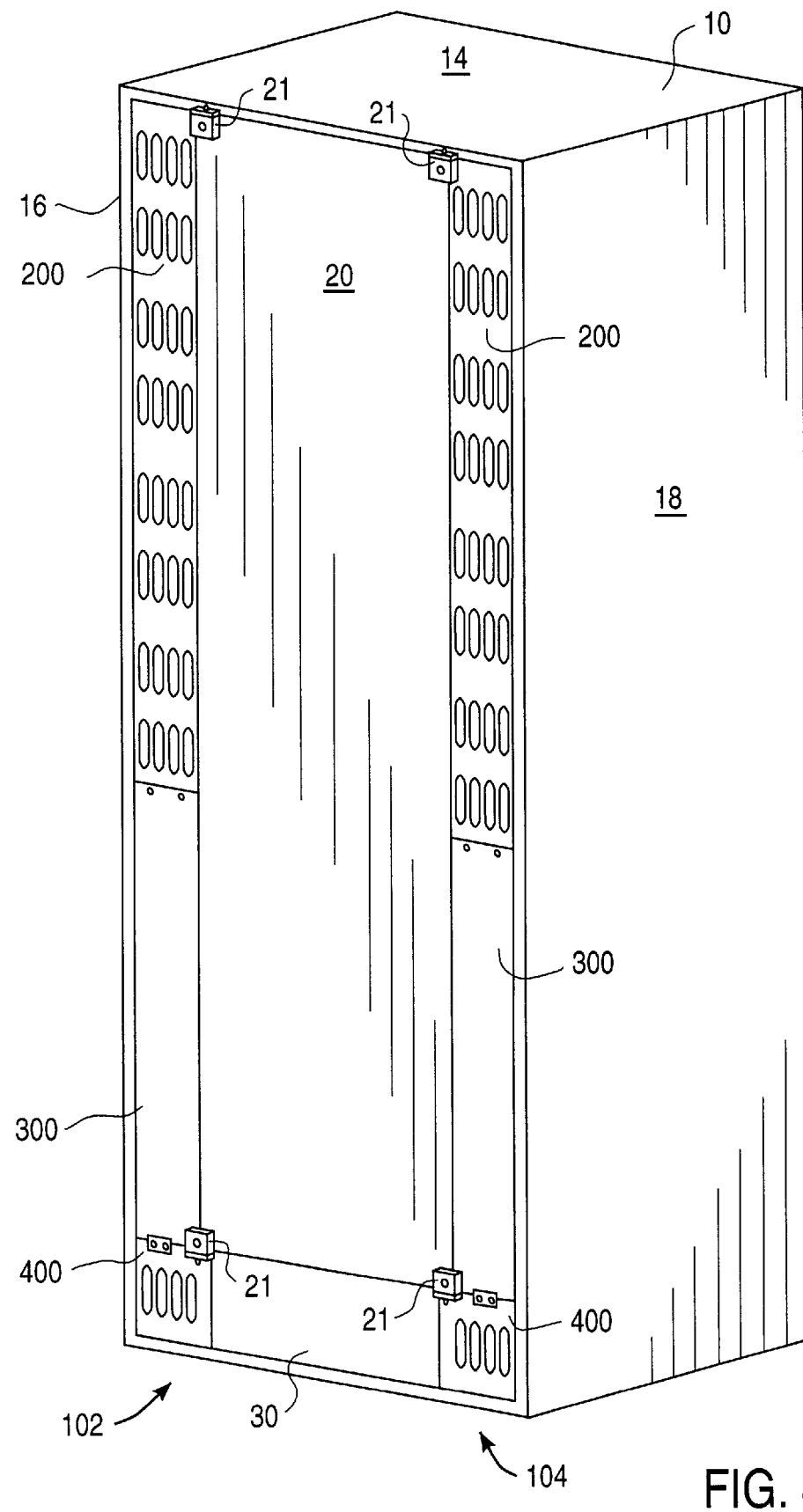
FIG. 4 shows the rear view of the cabinet of FIG. 1 with the I/O panels installed in accordance with the present invention.

FIG. 4 shows a rear view of an assembled cabinet, incorporating the I/O panels of the invention. The left and right panel subassemblies 102, 104 are shown attached to the respective sidewalls 16, 18 of the cabinet 10. The panel assemblies occupy only a small portion of the rear opening of the cabinet. The remaining area between the panel subassemblies is taken up by a rear cabinet door 20 which opens up to provide access to the rear 82 of the backplane 80 within the cabinet. A rear cabinet panel 30 occupies the lower portion of the rear of the cabinet.

Figure 5:
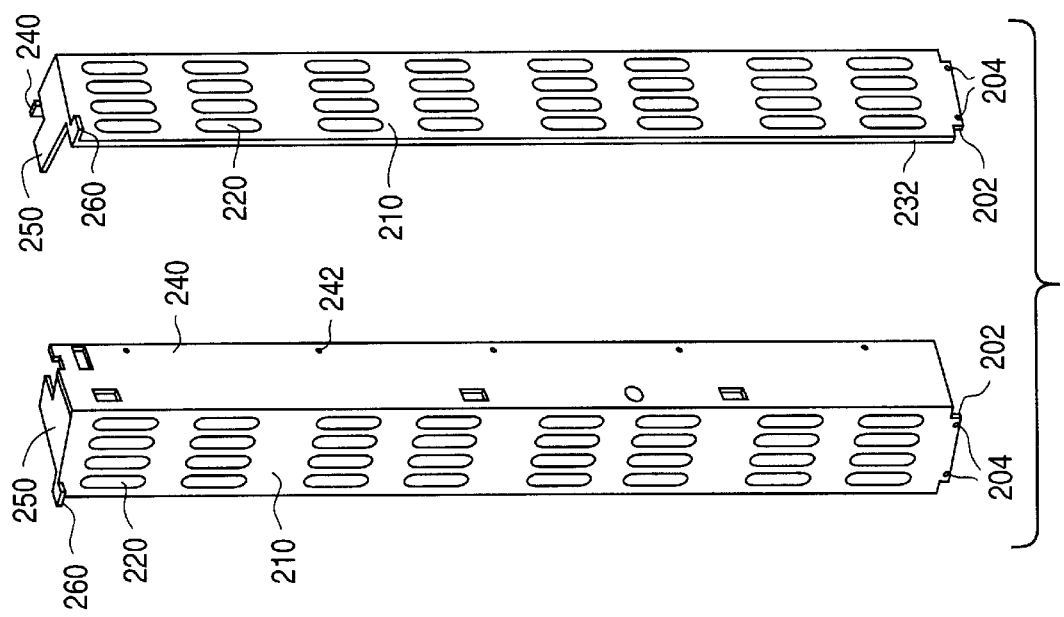
FIG. 5 presents right and left perspective views of an upper connector plate.
Figure 6:
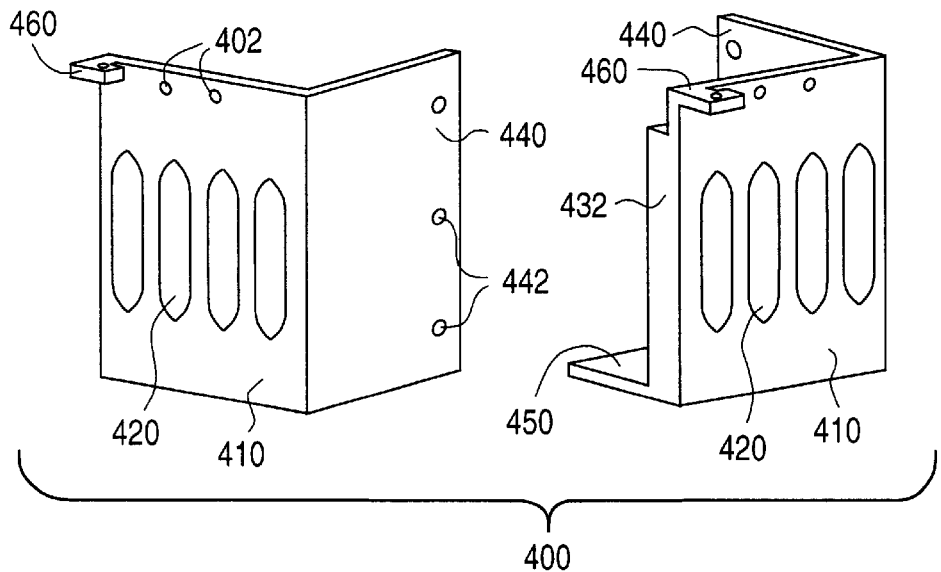
FIG. 6 presents right and left perspective views of a lower connector plate.
Figure 7:
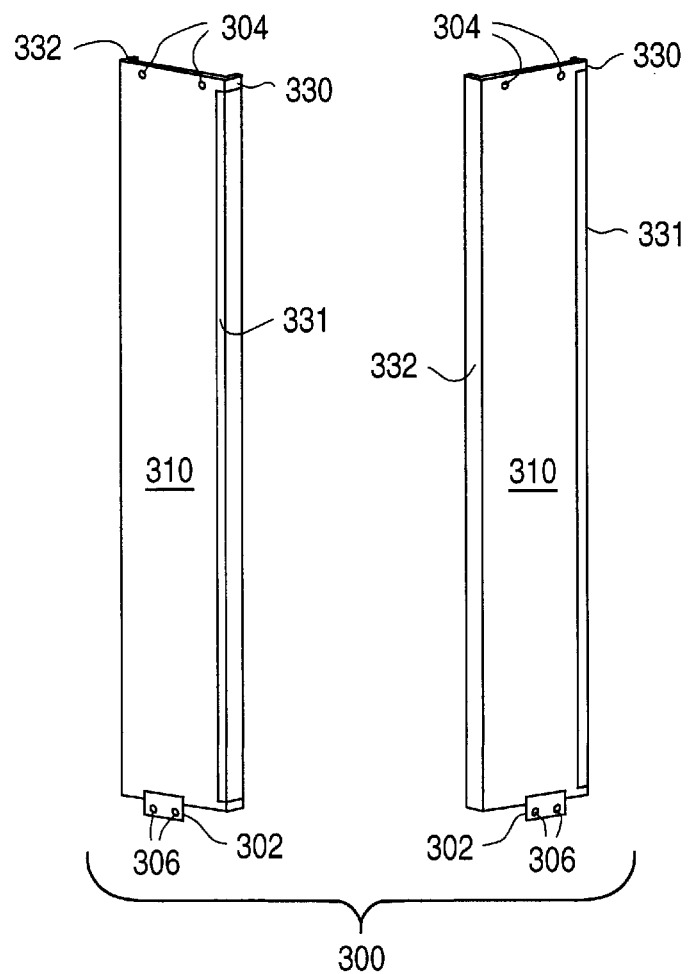
FIG. 7 presents right and left perspective views of a cover plate.
Figure 13:
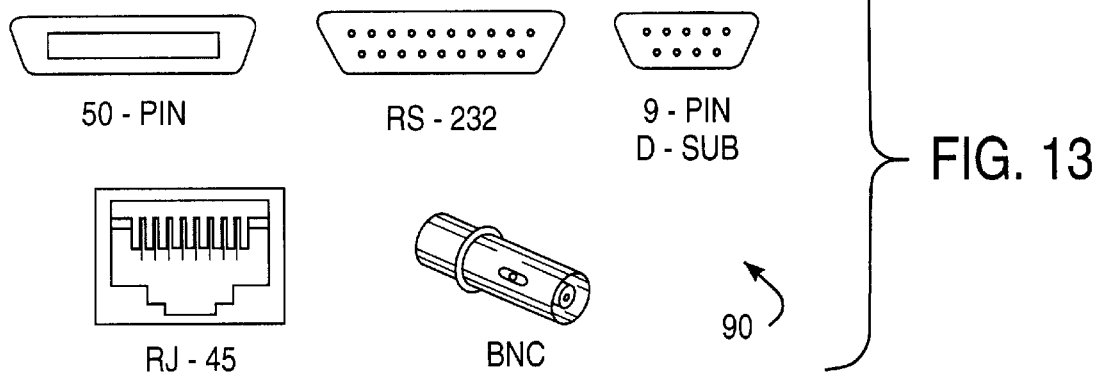
FIG. 13 shows typical connectors used with the I/O panels.

Turning to FIGS. 5–7, additional details of the panel subassembly components are provided. FIG. 5 shows right and left perspective views, showing the construction of an upper connector tray member (connector plate) 200. In particular, FIG. 5 shows a right-side upper connector plate. A left-side upper connector plate has a form factor that is a mirror image of the one shown in the figure. The upper connector plate 200 is an electrically conductive member, having a front face plate portion 210, a side mounting member 240 and an upper lip portion 250. The face plate 210 includes a set of openings 220 (punchouts, cutouts) formed through the plate. The openings 220 are shaped to receive cable connectors of various types, depending upon the cabling requirements for a given installation. Typical cable connectors 90 include, but are not limited to those shown in FIG. 13. These connectors are standard connectors used in the telephony industry, including 50-pin connectors, RS-232 connectors, 9-pin D-sub connectors, RJ-45 jacks and BNC connectors. In addition, while it is true that a left-side upper connector panel has a similar form factor as the right-side upper connector panel, it must be emphasized that different configurations of cutouts may be formed in each of the upper connector panels, thus maximizing the flexibility of the invention.

Next, side mounting member 240 of the upper connector plate 200 is shown in FIG. 5. The side mounting member 240 serves two purposes: it provides a means by which the connector plate is attached to the cabinet sidewall; and it ensures electromagnetic compatibility (EMC) by providing an EMI seal between the upper connector plate 200 and the sidewall 16, 18 of the cabinet (FIG. 1). The side mounting member 240 has a planar form which extends from an edge of the face plate 210 at a right angle relative to the face plate. Like the face plate, the side mounting member 240 is electrically conductive. The large surface area of the mounting member 240 provides an effective EMI seal when it comes into contact with the sidewall of the cabinet. A series of holes 242 are formed through the member 240. The holes 242 allow the upper connector plate 200 to be fastened with screws to the sidewall. While the above-described method of attaching the connector plate is commonly practiced, other equally effective methods of attachment are possible and would be obvious to one of ordinary skill in the telephony arts, and therefore fall within the scope of the present invention.

As can be seen in FIG. 5, the upper connector plate 200 also includes an upper lip portion 250. Like the side mounting member 240, the upper lip portion 250 provides EMC containment and may serve as an additional attachment site for securely mounting the connector plate to the sidewall of the cabinet. The upper lip portion 250 is electrically conductive and is a flat member which extends from the upper edge of the face plate 210 and contacts the bottom surface of the top portion 14 of the cabinet, thus providing EMC containment. Screw holes (not shown) may be formed in the upper lip portion 250 to further secure the upper connector plate 200 to the cabinet.

Turning now to the lower connector tray member 400 (connector plate), refer to FIG. 6. Shown are right and left perspective views of a lower connector plate 400. In particular, FIG. 6 shows a right-side lower connector plate. A left-side lower connector plate has a form factor that is a mirror image of the one shown in the figure. The lower connector plates are very similar to the upper connector plates 200 in their construction. A front face plate 410 has openings 420 formed therethrough. The openings 420 receive cable connectors 90, such as those shown in FIG. 13. As with the upper connector panels, the right-side and left-side lower connector panels may have different patterns of cable connector cutouts formed therein for flexibility in panel configuration. The lower connector plate 400 includes a side mounting member 440 similar in form and function to the side mounting member 240 of the upper connector plate 200. The lower connector plate 400 further includes a lower lip portion 450 formed at the bottom edge of the face plate 410. As with the upper lip portion 250, described above, the lower lip portion 450 provides EMC containment and may include screw holes (not shown) to provide additional securement of the lower connector plate 400 to the sidewall of the cabinet.

The cover plates of the left and right panel subassemblies 102, 104 will now be described with respect to the right and left perspective views of a cover plate 300 illustrated in FIG. 7. In particular, FIG. 7 shows a right-side cover plate, a left-side cover plate being a mirror image of the one shown in the figure. The cover plate 300 is primarily composed of a solid member 310 having a flange 330 formed along an edge thereof. Disposed on the flange 330 is a metal gasket 331.

The discussion will now focus on the assembly of the left and right panel subassemblies 102, 104 in accordance with the present invention and with reference to FIGS. 1 and 5–7. The upper connector plate 200 includes a coupling tab 202 formed along the bottom edge of the face plate 210. The upper connector plate 200 is attached to the cover plate 300 by aligning holes 204 formed through the coupling tab 202 with holes 304 formed through the solid member 310 of the cover plate 300, and fastening the two pieces together with screws 40 (FIG. 1). Next, the solid member 310 of the cover plate 300 includes a coupling tab 302 formed along the bottom edge of the solid member. The cover plate 300 is attached to the lower connector plate 400 by aligning holes 306 formed through the coupling tab 302 of the cover plate 300 with holes 402 formed through the face plate 410 of the lower connector plate 400, and fastening the two pieces together with screws 42 (FIG. 1). Both the left and the right panel subassemblies 102, 104 are assembled in this manner.

Recall that only the upper and lower connector plates 200, 400 have mounting members 240, 440 which provide both EMC containment and a means for attachment to the cabinet sidewalls. Since the cover plates 300 are attached to the upper and lower connector panels, there is no need to have mounting members on the cover plates. However, EMC containment is still needed at the cover plate-to-sidewall interface to prevent EMI radiation. The metal gasket 331 disposed on the flange member 330 of the cover plate provides the necessary EMC containment. In each of the panel subassemblies 102, 104, the flange 330 of the cover plate 300 is vertically aligned with the mounting members 240, 440. When the subassemblies 102, 104 are installed in the cabinet 10, as shown in FIG. 4, the metal gaskets 331 of the cover plates 300 abut the sidewalls 16, 18, thus ensuring that proper EMI seals are formed between the cover plates and sidewalls.

The discussion will now return to the description of the rear of the cabinet 10, referring once again to FIGS. 4–7. The upper connector plate 200 includes an upper hinge attachment 260 formed on the face plate 210. In like manner, the lower connector plate 400 includes a lower hinge attachment 460. Although FIGS. 5 and 6 illustrate right-side connector plates 200, 400, similar hinge attachments 260, 460 are formed on the left-side upper and lower connector plates. This enables the rear cabinet door 20 to be attached for opening either on the right-side or the left-side.

In one embodiment of the present invention, the cabinet door 20 includes selectively retractable hinge members 21 attached at the corners thereof. Hinge pins housed within the hinge members 21 protrude therefrom and fit into the upper and lower hinge attachments 260, 460 of the upper and lower connector plates 200, 400 as shown in FIG. 4. The hinge pins have locking mechanisms which lock the pins either in a protruding position or in a recessed position within the housing. An opening formed in the front of the housing of each of the hinge members 21 provides a keyed access for retraction of the hinge pin in order to disengage the hinge member from the hinge attachment 260, 460 of the connector plate 200, 400. Thus, by retracting the top and bottom hinge pins on the right side of the cabinet door 20, the door can be opened from the right. Conversely, retracting the hinge pins of the left side of the cabinet door allows the door to open from the left. This feature provides maximum flexibility for access to the interior of the cabinet while at the same time securing the interior from unauthorized entry. It is noted, however, that this feature is not critical to the present invention. Conventional cabinet doors using standard hinge arrangements are contemplated for use in the present invention and would not impede the practice of the present invention.

Since the middle region of the rear of the cabinet 10 is closed off by the rear cabinet door 20 and the rear cabinet panel 30, additional EMI seals are needed to ensure complete EMC containment. The connector plates 200, 400 and the cover plate 300 include gasket interface surfaces for this purpose. With respect to the connector plates 200, 400, gasket interface surfaces 232, 432 are formed on the edge of the face plates 210, 410 opposite the side having the mounting members 240, 440. With respect to the cover plate 300, the gasket interface surface 332 is formed on a side of the solid member 310 opposite the side having the flange 330. Metal gasket material (not shown) is disposed along the edges of both the cabinet door 20 and the cabinet panel 30. Thus, with respect to the arrangement shown in FIG. 4, closure of the cabinet door 20 causes the gasket material disposed on the door to come into contact with the gasket interface surfaces 232, 332 of the upper connector plates 200 and the cover plates 300, thus forming an EMI seal. Similarly, installation of the cabinet panel 30 results in an EMI seal between the cabinet panel and the lower connector plate 400. Similar EMI seals are formed between the upper edge of the cabinet door 20 and the top portion 14 of the cabinet 10, between the lower edge of the cabinet panel 30 and the bottom plate 12 of the cabinet and between the lower edge of the cabinet door and the upper edge of the cabinet panel.

Figure 8:
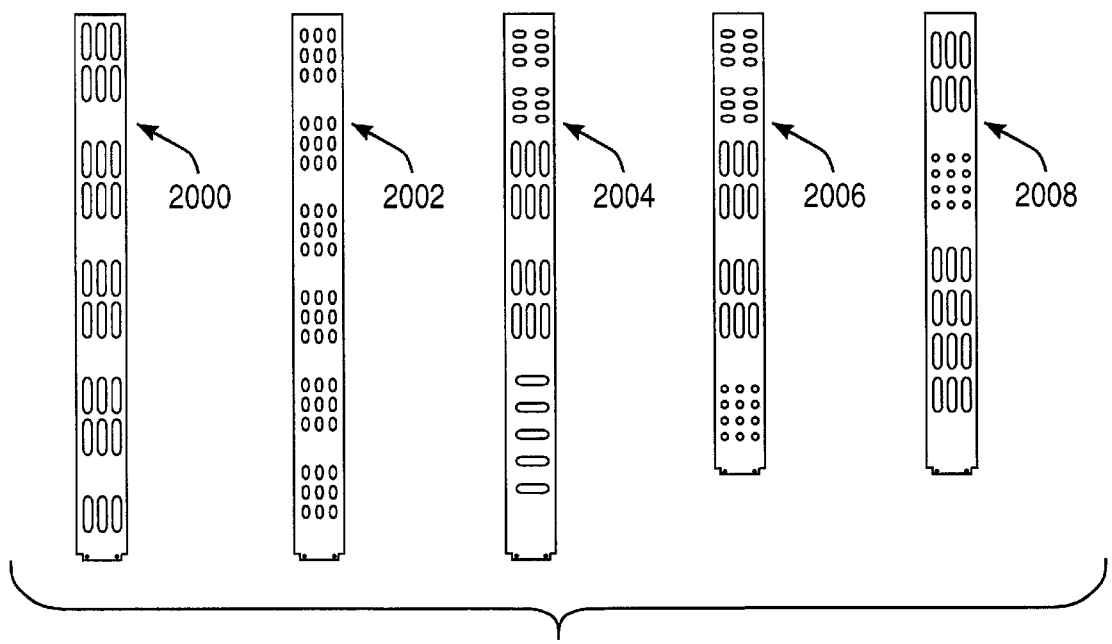
FIG. 8 shows a plurality of upper connector plates.
Figure 9:
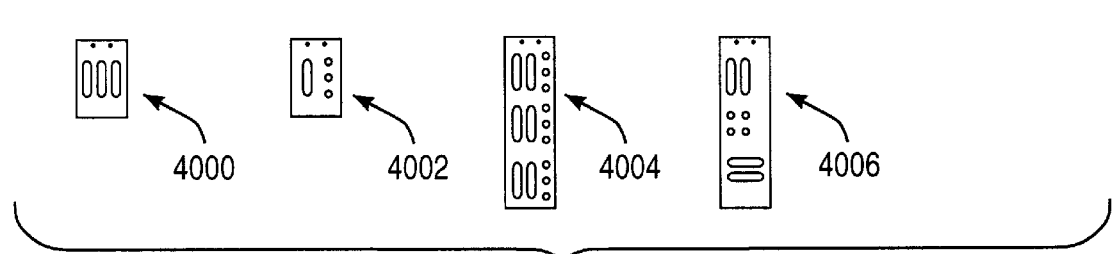
FIG. 9 shows a plurality of lower connector plates.

The discussion will now turn to the interchangeability of the components of the I/O panels in accordance with the present invention. Referring to FIGS. 1–3 and 8–10, each of the upper and lower connector plates 200, 400 and the cover plates 300 of the I/O panel assembly 100 are selected from a plurality of panels. For example, FIG. 8 shows a set of upper connector plates 2000–2008, each having a different pattern of connector punchouts to accommodate different configurations of cable connectors. In addition, some of the upper connector plates 2000–2008 have different lengths. In like manner, FIG. 9 shows a set of lower connector plates 4000–4006 having varying configurations of connector punchouts and lengths. The different length connector plates are provided to allow for variations in system capacity requirements which may affect the number and arrangement of components installed in the cabinet 10 of the system. In order to keep the overall length of the I/O panel assembly equal to the cabinet height, the cover plates 3000–3004 shown in FIG. 10 have different lengths to compensate for variations in the lengths of the upper and lower connector plates 2000–2008, 4000–4006.

Figure 10:
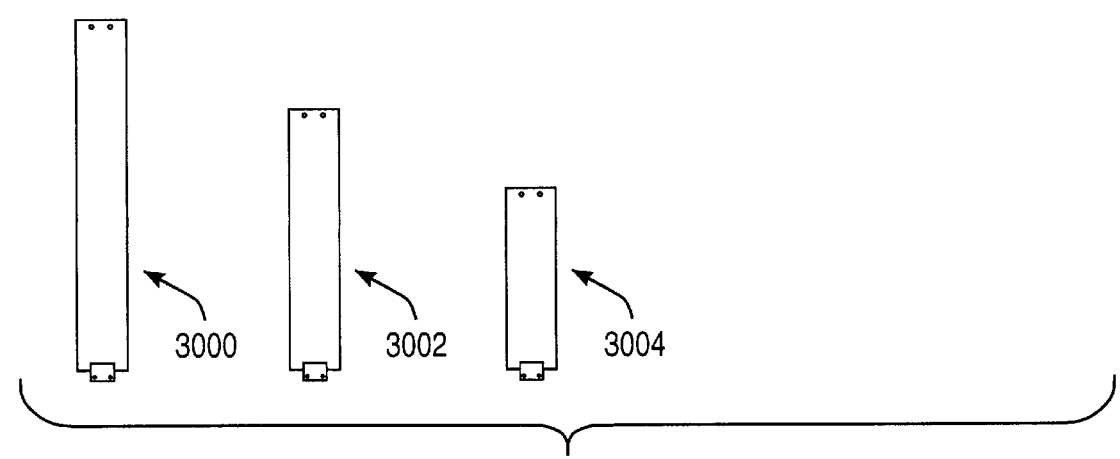
FIG. 10 shows a plurality of cover plates.

It can be seen that numerous configurations of I/O panel assemblies are possible by selecting panels from each of the sets of panels shown in FIGS. 8–10. Each of the left and right I/O panel subassemblies 102, 104 (FIG. 1) is constructed simply by selecting an appropriate upper connector plate from the set of upper connector plates 2000–2008, selecting an appropriate lower connector plate from the set of lower connector plates 4000–4006 and selecting an appropriate cover plate from the set of cover plates 3000–3004. By having a small number of interchangeable components, as exemplified by the twelve components illustrated in FIGS. 8–10, a large number of cabling configuration combinations (approximately sixty) is possible. The advantage over the prior art approach is clear. Achieving the same number of combinations using the prior art method of fixed configuration panels would require as many panels as there are cabling configuration combinations. In this case, approximately sixty fixed configuration panels would be required to provide the same flexibility attainable simply by mixing and matching the twelve interchangeable panel components exemplified in FIGS. 8–10.

Figure 11:
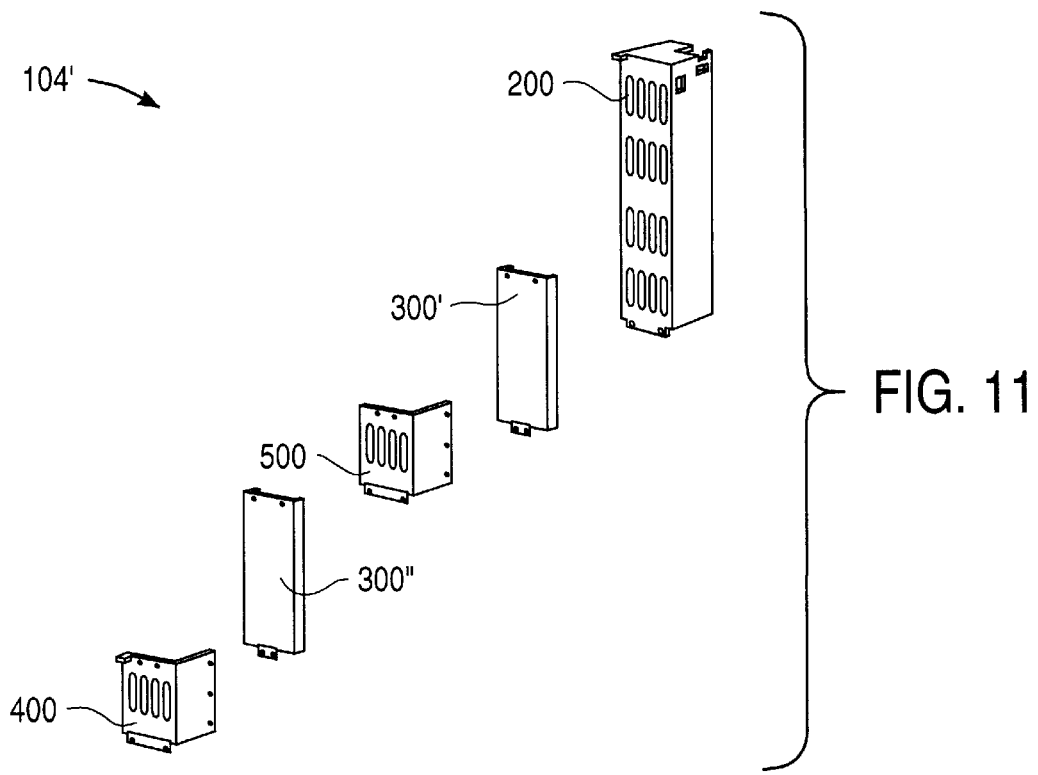
FIG. 11 is an embodiment of the present invention which incorporates an additional connector plate.

Further flexibility can be realized by recognizing that an I/O panel subassembly 102, 104 can include panels in addition to the upper and lower connector plates and cover plate described above. FIG. 11 shows such an arrangement, depicting a right-side I/O panel subassembly 104'. The subassembly includes the upper and lower connector plates 200, 400 described above. In addition, an intermediate connector plate 500 is interposed between two cover plates 300', 300". The intermediate connector plate 500 is essentially of the same construction as either of the upper and lower connector plates 200, 400. However, because of the positioning of the intermediate plate 500, the lip portions 250, 450 found in the upper and lower plate are absent as are the hinge attachments 260, 460.

Figure 12:
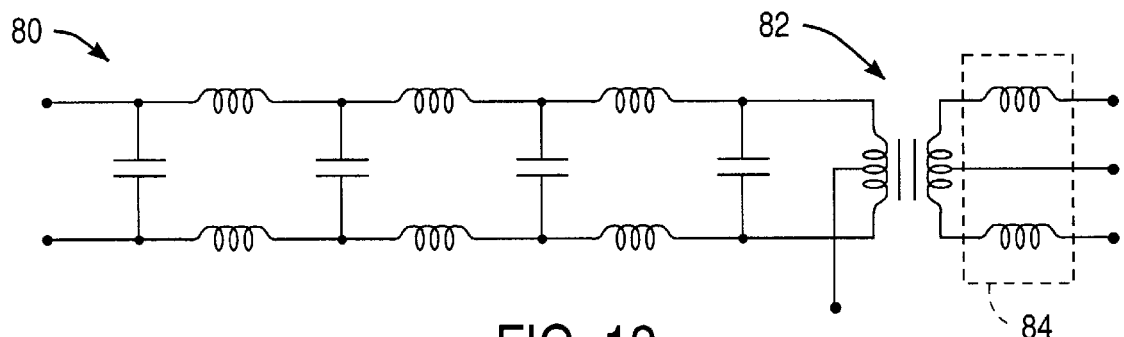
FIG. 12 illustrates a typical signal conditioning circuit used in the present invention.

Another feature of the present invention is the ability to effectively ground and shield the connectors received in the connector plates 200, 400. Circuitry for shielding and general signal conditioning can be provided on the connector plates themselves. FIG. 12 shows a schematic diagram of a typical circuit which incorporates a filter circuit 80, an isolation transformer 82 and a common mode choke coil 84. These and other circuits are known, and the substitution of other signal conditioning circuitry can be readily accomplished to meet the shielding requirements of the particular installation.

We claim:

1. A configurable I/O panel to be installed in a cabinet along sidewalls of the cabinet, the configurable I/O panel comprising:

a plurality of first connector plates and a plurality of second connector plates from which to select a proper subset for attachment to the cabinet, each connector plate being electrically conductive, each connector plate having a mounting means for attachment thereof to a sidewall of the cabinet and further having cutouts shaped to receive cable connectors for use in a private branch exchange (PBX) system; and a first panel assembly including a selected one of the first connector plates and a selected one of the second connector plates, the selected one of the first connector plates being in fixed vertical relation to the selected one of the second connector plates.

2. The configurable I/O panel of claim 1 further including a plurality of cover plates each having a sidewall-contacting portion; the first panel assembly further including a first cover plate selected from the plurality of cover plates, the first cover plate being removably attached to at least one of the selected ones of the first and second connector plates; the sidewall-contacting portion of the first cover plate being vertically aligned with the mounting means of the selected ones of the first and second connector plates; whereby each of the mounting means and the sidewall-contacting portion abut a sidewall of the cabinet upon installation of the configurable I/O panel into the cabinet thereby providing EMC containment.

3. The configurable I/O panel of claim 2 further including a second panel assembly, the second panel assembly including third and fourth connector plates selected respectively from the plurality of first connector plates and the plurality of second connector plates and a second cover plate selected from the plurality of cover plates, the second panel assembly being disposed in opposed relation to the first panel assembly, whereby the first and second panel assemblies each are attached to opposite sidewalls upon installation of the configurable I/O panel into the cabinet.

4. The configurable I/O panel of claim 1 wherein the first and second connector plates each has a major surface through which the cutouts are formed and the mounting means is a lateral member extending from a side of the connector plate in a direction perpendicular to the major surface, the lateral member having a surface which serves to contact the sidewall of the cabinet.

5. The configurable I/O panel of claim 4 wherein the sidewall-contacting portion of each of the cover plates includes a surface and a metal gasket disposed on the surface.

6. The configurable I/O panel of claim 5 wherein the first and second connector plates each includes a gasket interface surface formed on a side opposite the side from which the lateral member extends, and the cover plates each includes a gasket interface surface disposed opposite the sidewall-contacting portion; and the gasket interface of the first cover plate is aligned with the gasket interface surfaces of the selected ones of the first and second connector plates.

7. The configurable I/O panel of claim 1 further including cable connectors received within the cutouts, the cable connectors being at least one of a 50-pin connector, an RS-232 connector, a 9-pin D-sub connector, an RJ-45 jack and a BNC connector.

8. The configurable I/O panel of claim 7 wherein at least one of the connectors includes a signal pin and electrical means for conditioning signals carried by the signal pin.

9. The configurable I/O panel of claim 1 wherein the first panel assembly further includes a third connector plate.

10. In a telephony system wherein a cabinet having opposed vertical sidewalls is employed to house a plurality of communication circuits, a power subsystem and a computing subsystem, a configurable I/O panel assembly for accommodating the cabling requirements of different communication environments to provide access to I/O channels of the plurality of communication circuits and of the computing subsystem and to provide access to the power subsystem, the configurable I/O panel assembly comprising:

a first panel subassembly and a second panel subassembly, each panel subassembly having an upper connector tray coupled to and vertically aligned with a cover plate, the cover plate being coupled to and vertically aligned with a lower connector tray;

each of the upper connector trays including a front plate having a plurality of openings formed therethrough shaped to receive cable connectors for use in a private branch exchange (PBX) system and further including a mounting plate projecting perpendicularly from a side of the front plate;

each of the lower connector trays including a front plate having a plurality of openings formed therethrough and further including a mounting plate projecting perpendicularly from a side of the front plate;

each of the cover plates having a flange formed along a side thereof and a gasket disposed on a surface of the flange;

for each of the first and second panel subassemblies, the mounting plates of the upper and the lower connector trays and the surface of the flange are generally vertically aligned;

whereby the first and second panel assemblies are mounted to the cabinet so that the gaskets associated with the first and second panel subassemblies come into contact with the vertical sidewalls.

11. The configurable I/O panel assembly of claim 10 further including a plurality of connector trays from which the upper and lower connector trays of the first and second panel subassemblies are selected, and a plurality of cover plates from which the cover plates of the first and second panel subassemblies are selected.

12. The configurable I/O panel assembly of claim 10 wherein:

the upper and lower connector trays of the first and second panel subassemblies each includes a gasket interface formed on a side of the front plate opposite the side from which the mounting plate projects; and the cover plates of the first and second panel subassemblies each includes a gasket interface formed on a side opposite the flange;

whereby a gasketed cabinet door installed between the first and second panel subassemblies makes contact with the gasket interfaces to provide EMC containment of the interior of the cabinet.

13. The configurable I/O panel assembly of claim 10 further including at least one intermediate connector tray coupled to and vertically aligned with the first panel subassembly.

14. The configurable I/O panel assembly of claim 10 further including cable connectors received in the openings formed through the connector trays, each of the cable connectors having signal pins and means coupled to the signal pins for conditioning signals carried by the signal pins.

15. The configurable I/O panel assembly of claim 14 wherein the means for conditioning includes at least one of common mode choke coils, electronic filters and isolation transformers.

16. A telecommunications cabinet used in telephony systems for housing a plurality of communication circuits, a power subsystem and a computing subsystem, the telecommunications cabinet comprising:

a top and a bottom;

a left sidewall and a right sidewall facing opposite the left sidewall, each sidewall being disposed between the top and the bottom;

first and second left-side connector panels, each having cutouts formed therethrough for receiving cable connectors, the left-side connector panels being coupled proximate to an edge of the left sidewall; the first left-side connector panel being vertically positioned proximate to the plurality of communication circuits, the second left-side connector panel being vertically positioned proximate to the computing subsystem;

a first plurality of cable connectors received in the cutouts of the first and second left-side connector panels for connecting to the plurality of communication circuits and to the computing subsystem, respectively;

a left-side cover panel vertically aligned with and coupled to at least one of the first and second left-side connector panels, the left-side cover panel being vertically positioned proximate to the power subsystem for access thereto;

first and second right-side connector panels, each having cutouts formed therethrough for receiving cable connectors, the right-side connector panels being coupled proximate to an edge of the right sidewall; the first right-side connector panel being vertically positioned proximate to the plurality of communication circuits, the second right-side connector panel being vertically positioned proximate to the computing subsystem;

a second plurality of cable connectors received in the cutouts of the first and second right-side connector panels for connecting to the plurality of communication circuits and to the computing subsystem, respectively; and a right-side cover panel vertically aligned with and coupled to at least one of the first and second right-side connector panels, the right-side cover panel being vertically positioned proximate to the power subsystem for access thereto.

17. The telecommunications cabinet of claim 16 further including a plurality of connector panels from which the left-side connector panels and the right-side connector panels are selected, and a plurality of cover panels from which the left-side and right-side cover panels are selected.

18. The telecommunications cabinet of claim 16 wherein the cable connectors include at least one of a 50-pin connector, an RS-232 connector, a 9-pin D-sub connector, an RJ-45 jack and a BNC connector.

19. The telecommunications cabinet of claim 16 wherein at least one of the left-side connector panels and the right-side connector panels includes a third connector panel vertically aligned therewith and vertically positioned with one of the plurality of communication circuits and the computer subsystem.

20. The telecommunications cabinet of claim 16 further including signal conditioning circuitry electrically coupled to at least one of the cable connectors to provide grounding of the cable connector and filtering of signals carried by the cable connector.

* * * * *